United States Patent [19]

Yamauchi

[11] Patent Number: 5,516,988
[45] Date of Patent: May 14, 1996

[54] ELECTRONIC COMPONENT CHIP HOLDER FOR USE IN FORMING ELECTRODES ON ELECTRONIC COMPONENT CHIPS

[75] Inventor: Keishiro Yamauchi, Kyoto, Japan

[73] Assignee: Murata Manufacturing Co., Ltd., Japan

[21] Appl. No.: 114,333

[22] Filed: Aug. 30, 1993

[30] Foreign Application Priority Data

Sep. 3, 1992 [JP] Japan ..................... 4-235480

[51] Int. Cl.[6] ..................................... H05K 1/00
[52] U.S. Cl. .................. 174/250; 174/266; 174/260; 174/254; 361/749; 361/761
[58] Field of Search ..................... 174/254, 260, 174/266, 250; 361/749, 761, 778; 439/77

[56] References Cited

U.S. PATENT DOCUMENTS

| | | | |
|---|---|---|---|
| 3,049,647 | 8/1962 | Lincoln | 317/101 |
| 3,999,004 | 12/1976 | Chirino et al. | 174/68.5 |
| 4,336,419 | 6/1982 | Wakayama et al. | 174/68.5 |
| 4,381,321 | 4/1983 | Braden . | |
| 4,393,808 | 7/1983 | Braden . | |
| 4,395,184 | 7/1983 | Braden . | |
| 4,526,129 | 7/1985 | Braden . | |
| 4,868,980 | 9/1989 | Miller, Jr. | 29/850 |
| 5,245,751 | 9/1993 | Locke et al. | 29/852 |
| 5,309,322 | 5/1994 | Wagner et al. | 361/723 |
| 5,309,632 | 5/1994 | Takahashi et al. | 29/852 |
| 5,371,654 | 12/1994 | Beaman et al. | 361/744 |

*Primary Examiner*—Laura Thomas
*Attorney, Agent, or Firm*—Ostrolenk, Faber, Gerb & Soffen

[57] ABSTRACT

In an electronic component chip holder comprising a body of elastomer having a plurality of through holes which are so sized as to receive a plurality of electronic component chips one by one respectively and to hold the respective electronic component chips received therein, films of a metal, for example, providing higher slidability than elastomer are formed at least on inner peripheral surfaces of the through holes. Due to such metal films, a pressure for inserting the electronic component chips in the through holes can be reduced to inhibit the electronic component chips from chipping and cracking, whereby it is possible to improve rubber hardness of the elastomer so that the electronic component chip holder can be directed to a purpose requiring heat resistance with no problem.

22 Claims, 2 Drawing Sheets

ELECTRONIC COMPONENT CHIP HOLDER FOR USE IN FORMING ELECTRODES ON ELECTRONIC COMPONENT CHIPS

BACKGROUND OF THE INVENTION

1. Field of the Invention

The present invention relates to an electronic chip holder which is employed for simultaneously handling a plurality of electronic component chips, and a method of forming electrodes on electronic component chips using the same.

Throughout the specification, the term "electronic component chips" includes electronic component chips in states of partially fabricated items which are not yet provided with external terminals, for example, in addition to those in states of finished products.

2. Description of the Background Art

FIG. 2 is a perspective view showing the appearance of a conventional electronic component chip holder 1. FIG. 3 is a sectional view showing a part of the holder 1 shown in FIG. 2 in an enlarged manner. Holders which are substantially identical in structure to this holder 1 are described in U.S. Pat. Nos. 4,381,321, 4,393,808, 4,395,184 and 4,526,129, for example.

The holder 1 is in the form of a plate as a whole, and is provided with a plurality of through holes 3 which are so sized as to receive a plurality of electronic component chips 2 one by one respectively and to hold the electronic component chips 2 received therein.

The body of the holder 1 is formed by an elastomer member 4, in which core members 5 of stainless steel, for example, are embedded in order to reinforce the same.

The electronic component chips 2 are ceramic capacitors, for example. The electronic component chips 2 are inserted in the respective through holes 3 of the holder 1 along the same direction, so that electrodes for serving as external terminals of such ceramic capacitors, for example, can be simultaneously formed on the plurality of electronic component chips 2. The sizes of the through holes 3 are designed to be smaller than sectional sizes of the electronic component chips 2, so that the electronic component chips 2 inserted therein can be held by elasticity of the elastomer member 4.

In general, rubber hardness of the elastomer member 4 is reduced or the sizes of the through holes 3 are increased, in order to prevent the electronic component chips 2 from chipping and cracking caused by an insertion pressure for inserting the same in the through holes 3.

Depending on the purpose of the holder 1, however, it may be necessary to considerably increase rubber hardness of the elastomer member 4 in order to improve heat resistance thereof, for example. The holder 1 must have high heat resistance when electrodes are formed on the electronic component chips 2 by dry plating, electrodes formed on the electronic component chips 2 are further coated with solder films, resin members coating the electronic component chips 2 are baked, and the like.

In such a holder 1 having the elastomer member 4 which is increased in rubber hardness, an insertion pressure for the electronic component chips 2 is apt to be increased and hence the electronic component chips 2 are often chipped or cracked. Although the sizes of the through holes 3 may be increased in order to reduce the insertion pressure, such increase is restricted. Thus, purpose of the holder 1 which is formed by the elastomer member 4 is limited.

SUMMARY OF THE INVENTION

Accordingly, an object of the present invention is to provide an electronic component chip holder which can reduce an insertion pressure for electronic component chips even if rubber hardness of an elastomer member is increased.

Another object of the present invention is to provide a method of forming electrodes on electronic component chips using such an electronic component chip holder.

The present invention is first directed to an electronic component chip holder comprising a body of elastomer having a plurality of through holes which are so sized as to receive a plurality of electronic component chips one by one respectively and to hold the respective electronic component chips received therein. In order to solve the aforementioned technical problem, films of a material providing higher slidability than elastomer are formed at least on inner peripheral surfaces of the through holes.

The present invention also provides a method of forming electrodes on electronic component chips using the aforementioned electronic component chip holder. This method comprises steps of preparing the aforementioned electronic component chip holder, then inserting a plurality of electronic component chips in the respective through holes of the holder along a prescribed direction so that the plurality of electronic component chips are held by the holder, and forming electrodes on surfaces, which are exposed from the through holes, of the plurality of electronic component chips in such states.

According to the present invention, the films of a material providing higher slidability than elastomer are formed on the inner peripheral surfaces of the through holes, whereby it is possible to reduce an insertion pressure for inserting the electronic component chips in the through holes.

According to the present invention, therefore, it is possible to reduce the insertion pressure for inserting the electronic component chips in the through holes while improving rubber hardness of the elastomer, whereby the holder can be applied to a purpose requiring heat resistance with no problem while reducing failures such as chipping and cracking of the electronic component chips.

According to the present invention, further, slidability is so improved in the inner peripheral surfaces of the through holes that it is possible to suppress wear of the inner peripheral surfaces of the through holes caused by repeated insertion of the electronic component chips. Thus, it is also possible to increase the life of the holder. Further, the electronic component chips can be prevented from adhesion of the elastomer.

The films of a material providing higher slidability than elastomer are suitably prepared from metal thin films, since such metal thin films have high heat resistance. The metal thin films are formed by vacuum vapor plating, for example, sufficiently in thicknesses of not more than 1 μm. Alternatively, the films of a material providing high slidability may be made of a material other than a metal. In any case, the films preferably have not only high slidability but high heat resistance. The metal thin films may be replaced by coatings of fluorine-contained resin which are formed by dipping the body of the holder in a solution of such resin and drying the same.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
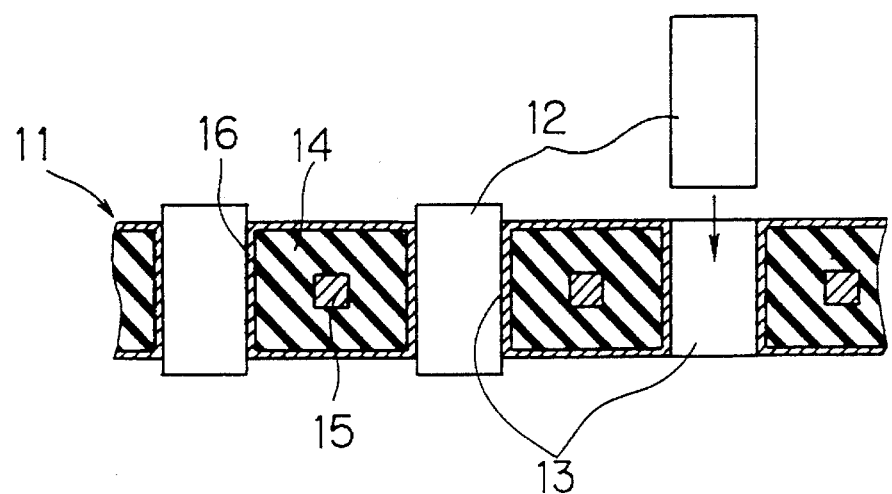
FIG. 1 is a sectional view showing a part of an electronic component chip holder 11 according to an embodiment of the present invention in an enlarged manner.
Figure 2:
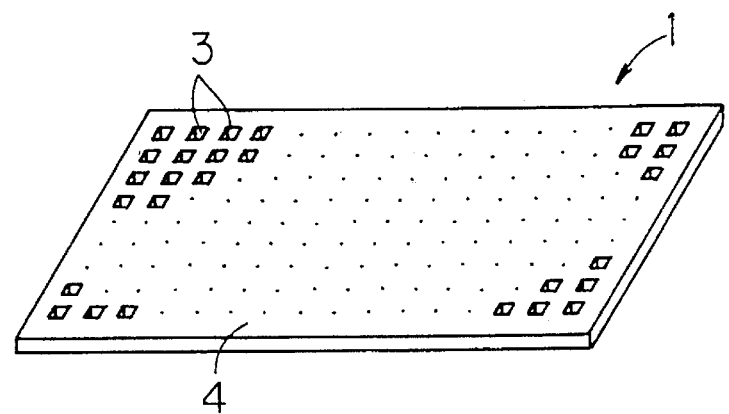
FIG. 2 is a perspective view showing the overall appearance of a conventional electronic component chip holder 1.
Figure 3:
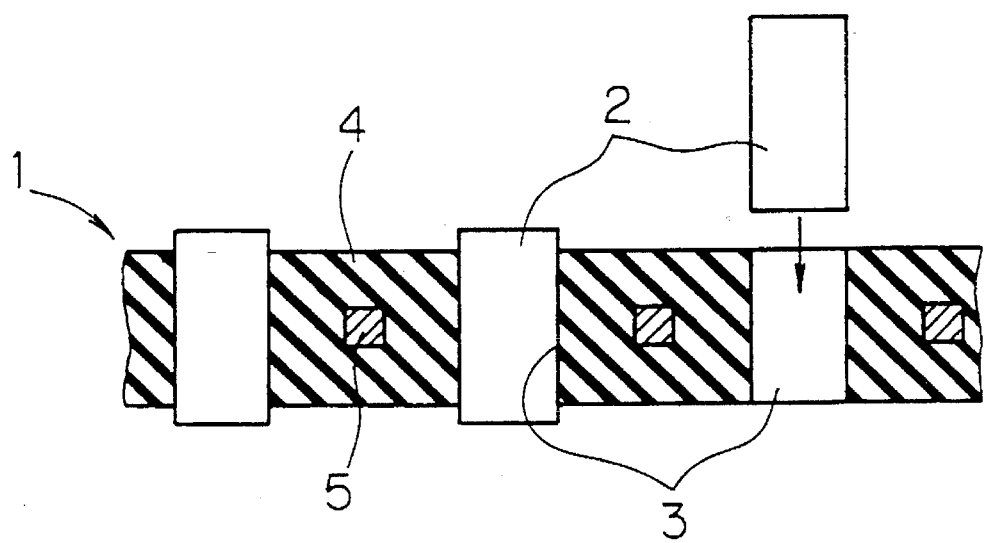
FIG. 3 is a sectional view showing a part of the electronic component chip holder 1 shown in FIG. 2 in an enlarged manner.

FIG. 1 is a sectional view corresponding to FIG. 3, showing an electronic component chip holder 11 according to an embodiment of the present invention. This holder 11 is substantially similar in structure to the aforementioned holder 1 shown in FIG. 2.

The holder 11 has a plurality of through holes 13 which are so sized as to receive a plurality of electronic component chips 12 one by one respectively and to hold the respective electronic component chips 12 received therein. The body of the holder 11 is formed by an elastomer member 14, in which core members 15 of stainless steel, for example, are embedded in order to reinforce the same.

The structure heretofore described is similar to that of the conventional holder 1. In the holder 11 according to the present invention, films 16 of a material providing higher slidability than the elastomer member 14 are further formed at least on inner peripheral surfaces of the through holes 13. Due to a formation method as described below, the films 16 are formed not only on the inner peripheral surfaces of the through holes 13, but on both major surfaces of the holder 11.

When electrodes for serving as external terminals are formed by vacuum vapor plating on the electronic components 12 such as ceramic capacitors, for example, the elastomer member 14 is advantageously prepared from fluorinated rubber. Such fluorinated rubber is suitable for vacuum vapor deposition since the same has excellent heat resistance and exhibits an extremely small amount of low molecule generation.

The films 16 are formed by carrying out vacuum vapor plating after a structure corresponding to the holder 1 shown in FIG. 3 is obtained in a state not yet receiving the electronic components, thereby depositing a metal on this structure. Preferably, the films 16 are defined by silver-based metal thin films which are formed by vacuum deposition or sputtering to be not more than 1 μm in thickness. The films are rendered to be not more than 1 μm in thickness in order to prevent the surface of the elastomer member 14 from thermal damage, while a silver-based metal is employed due to excellent adhesion to the elastomer member 14.

The electronic component chips 12 are inserted in the through holes 13 of the as-obtained holder 11 respectively along a prescribed direction, so that the plurality of electronic component chips 12 are held by the holder 11. It has been confirmed possible to substantially halve an insertion pressure for every electronic component chip 12 as compared with the holder 1 shown in FIG. 3 which has no metal thin films. Consequently, it is possible to inhibit the electronic component chips 12 from chipping and cracking.

Then, vacuum vapor plating is again carried out in order to form electrodes on the plurality electronic component chips 12 which are held by the holder 11 in the aforementioned manner. At this time, the electrodes are formed on surfaces of the electronic component chips 12 which are exposed from the through holes 13.

Although the thickness of the holder 11 is so selected as to simultaneously expose both longitudinal end portions of the electronic component chips 12 in the aforementioned embodiment, such a thickness-direction size of the holder 11 may alternatively be increased beyond the longitudinal sizes of the electronic component chips 12. In this case, the electronic component chips 12 are so moved in the through holes 13 that the respective end portions thereof are separately exposed from the through holes 13, in order to form electrodes on both longitudinal end portions of the electronic component chips 12.

Further, the electronic component chips 12 may be so inserted in the through holes 13 that the longitudinal directions thereof are directed toward the major surfaces of the holder 11. In this case, the surfaces exposed from the through holes 13 may be so properly masked that a plurality of electrodes are formed on one surface of each electronic component chip 12.

In addition, the inventive electronic component chip holder may be applied to a purpose other than the aforementioned formation of electrodes, such as efficient measurement of characteristics of a plurality of electronic component chips.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic component chip holder for receiving a plurality of electronic component chips and holding them with ends of said chips exposed for having electrodes formed thereon, said holder comprising:

a body of elastomer having a plurality of through holes being so sized as to receive a plurality of electronic component chips one by one respectively and to hold respective said electronic component chips being received therein; and films being formed at least on inner peripheral surfaces of said through holes, said films being made of a material providing higher slidability than said elastomer.

2. An electronic component chip holder in accordance with claim 1, wherein said films have heat resistance.

3. An electronic component chip holder in accordance with claim 2, wherein said films comprise metal thin films.

4. An electronic component chip holder in accordance with claim 3, wherein said metal thin films are not more than 1 μm in thickness.

5. An electronic component chip holder in accordance with claim 3, wherein said metal thin films are formed by vacuum vapor plating.

6. An electronic component chip holder in accordance with claim 3, wherein said metal thin films are made of a silver-based metal.

7. An electronic component chip holder in accordance with claim 1, wherein said body has a thickness-direction size being capable of simultaneously exposing both end portions of said electronic component chips.

8. An electronic component chip holder for receiving a plurality of elongated electronic component chips, said chips each having two ends and longitudinal, width and height dimensions, and for holding said chips with their ends exposed for having electrodes formed thereon; said chip holder comprising:

a body of elastomer having a plurality of through holes being sized according to said width and height dimensions of said chips for elastically holding said chips;

said elastomer body further having a thickness determined according to said longitudinal dimension of said chips so that said ends of said chips held in said through holes can be exposed for having electrodes formed thereon; and films being formed at least on inner peripheral surfaces of said through holes, said films being made of a material providing greater slidability than said elastomer, for facilitating the receiving of said chips in said through holes.

9. An electronic component chip holder in accordance with claim 8, wherein said films have heat resistance.

10. An electronic component chip holder in accordance with claim 9, wherein said films comprise metal thin films.

11. An electronic component chip holder in accordance with claim 10, wherein said metal thin films are not more than 1 µm in thickness.

12. An electronic component chip holder in accordance with claim 10, wherein said metal thin films are formed by vacuum vapor plating.

13. An electronic component chip holder in accordance with claim 10, wherein said metal thin films are made of a silver-based metal.

14. An electronic component chip holder in accordance with claim 8, wherein said body has a thickness for being capable of simultaneously exposing both end portions of said electronic component chips.

15. In combination, the electronic component chip holder of claim 1, and a plurality of electronic component chips elastically held in said through holes with ends thereof projecting from said elastomer body.

16. The combination of claim 15, wherein said elastomer body is capable of applying an elastic force through said films so as to hold said chips in said through holes.

17. The combination of claim 15, wherein both ends of each of said chips project from said elastomer body.

18. An electronic component chip holder in accordance with claim 1, wherein said elastomer body is capable of applying an elastic force through said films so as to hold said chips in said through holes.

19. In combination, the electronic component chip holder of claim 8, and a plurality of electronic component chips elastically held in said through holes with ends thereof projecting from said elastomer body.

20. The combination of claim 19, wherein said elastomer body is capable of applying an elastic force through said films so as to hold said chips in said through holes.

21. The combination of claim 19, wherein both ends of each of said chips project from said elastomer body.

22. An electronic component chip holder in accordance with claim 8, wherein said elastomer body is capable of applying an elastic force through said films so as to hold said chips in said through holes.

* * * * *